(12) United States Patent
Tanzawa

(10) Patent No.: US 7,609,554 B2
(45) Date of Patent: *Oct. 27, 2009

(54) HIGH VOLTAGE SWITCHING CIRCUIT

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 61 days.

This patent is subject to a terminal disclaimer.

(21) Appl. No.: 11/848,511

(22) Filed: Aug. 31, 2007

(65) Prior Publication Data

US 2007/0297225 A1 Dec. 27, 2007

Related U.S. Application Data

(63) Continuation of application No. 11/448,062, filed on Jun. 6, 2006, now Pat. No. 7,272,046.

(30) Foreign Application Priority Data

Dec. 2, 2005 (JP) ............... 2005-350052

(51) Int. Cl.
*G11C 16/30* (2006.01)
(52) U.S. Cl. ............... 365/185.18; 365/72; 365/185.23; 365/189.11
(58) Field of Classification Search ............... 327/404, 327/405
See application file for complete search history.

(56) References Cited

U.S. PATENT DOCUMENTS

| | | | |
|---|---|---|---|
| 3,708,689 A | 1/1973 | Lattin | |
| 4,181,865 A * | 1/1980 | Kohyama | 327/75 |
| 4,451,748 A | 5/1984 | Amrany | |
| 4,689,495 A | 8/1987 | Liu | |
| 4,835,423 A | 5/1989 | de Ferron et al. | |
| 4,893,275 A * | 1/1990 | Tanaka et al. | 365/185.23 |
| 4,974,206 A * | 11/1990 | Iyama et al. | 365/185.23 |
| 4,988,894 A | 1/1991 | Takiba et al. | |
| 5,214,322 A | 5/1993 | Neidorff et al. | |
| 5,504,450 A * | 4/1996 | McPartland | 327/437 |
| 5,708,606 A | 1/1998 | Tanzawa et al. | |
| 5,861,735 A | 1/1999 | Uchida | |
| 6,411,554 B1 | 6/2002 | Kawai | |
| 6,512,698 B2 | 1/2003 | Kamei | |
| 6,696,880 B2 | 2/2004 | Pan et al. | |
| 7,023,259 B1 | 4/2006 | Daniell et al. | |
| 7,026,822 B1 | 4/2006 | Bald et al. | |
| 7,030,684 B2 | 4/2006 | Kim | |
| 7,049,767 B2 | 5/2006 | Wilhelm | |
| 7,053,689 B2 | 5/2006 | Kim | |
| 7,432,740 B2 * | 10/2008 | Kanzaki | 326/68 |

* cited by examiner

*Primary Examiner*—Tan T. Nguyen
(74) *Attorney, Agent, or Firm*—Leffert Jay & Polglaze, P.A.

(57) ABSTRACT

A high voltage switching circuit that has a depletion mode NMOS transistor, an enhancement mode PMOS transistor and, an enhancement mode NMOS transistor. A control circuit generates first and second control signals. A first control signal controls the enhancement mode NMOS transistor and a logical combination of both control signals provides a bias to control the PMOS transistor. The bias on the PMOS transistor provides a gate voltage greater than ground potential after the high voltage has been switched to the circuit output.

12 Claims, 5 Drawing Sheets

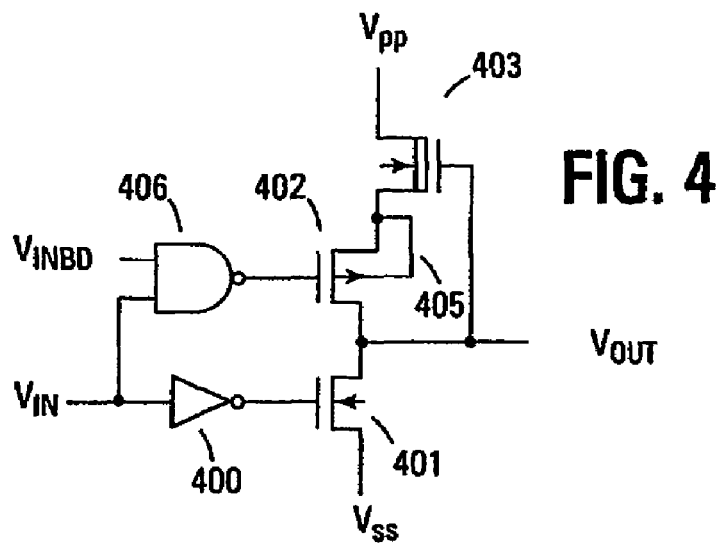
FIG. 4
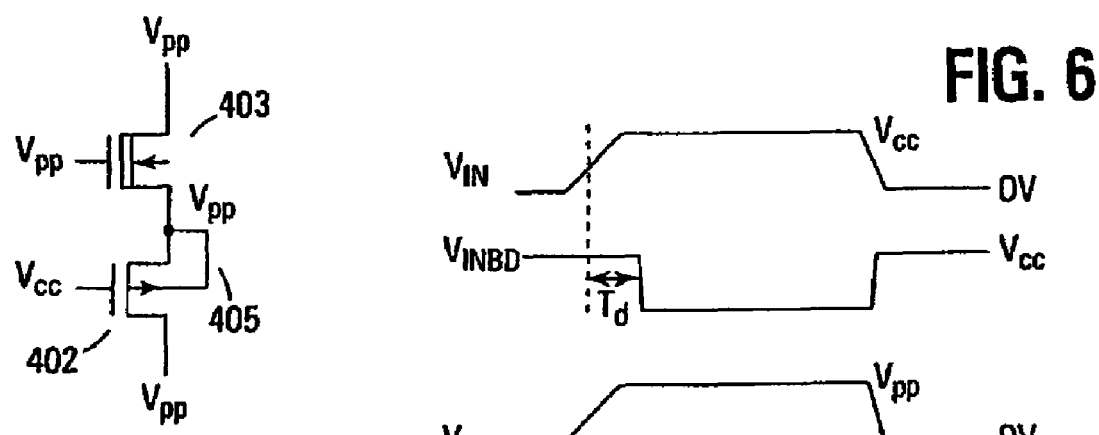
FIG. 5
FIG. 6
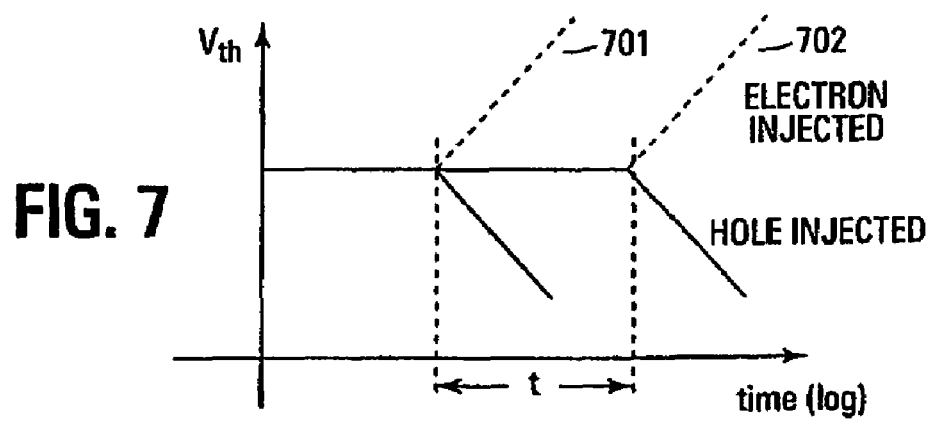
FIG. 7

HIGH VOLTAGE SWITCHING CIRCUIT

RELATED APPLICATIONS

This Application is a Continuation of U.S. application Ser. No. 11/448,062, titled "HIGH VOLTAGE SWITCHING CIRCUIT," filed Jun. 6, 2006 (allowed), now U.S. Pat. No. 7,272,046 which claims priority under 35 U.S.C. §119 of Japanese Application No. 2005-350052, filed on Dec. 2, 2005, the entire content of which is expressly incorporated by reference herein.

TECHNICAL FIELD OF THE INVENTION

The present invention relates generally to switching of high voltages.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory integrated circuits typically require relatively large voltages for programming and erasing operations. For example, the memory IC may have a supply voltage of 3V but require a program voltage of 20V.

FIG. 1 illustrates a typical prior art high voltage switching circuit. This circuit is composed of an enhancement mode n-channel metal oxide semiconductor field effect transistor (MOSFET) 101 connected in series to an enhancement mode p-channel MOSFET 102. An n-channel depletion mode MOSFET 103 is connected between the enhancement transistors 101, 102 and the high voltage, $V_{PP}$, to be switched. The gate of the depletion transistor 103 is connected to $V_{OUT}$. The substrate or well of the enhancement PMOSFET 102 is connected 105 to the source of the depletion NMOSFET 103. An inverter 100 inverts the $V_{IN}$ signal.

A logical one signal for $V_{IN}$ is inverted by the inverter 100 to a logical zero. This turns off the enhancement mode NMOSFET 101 and $V_{OUT}$ is charged to $V_{PP}$ through the enhancement mode PMOSFET 102 and the depletion mode NMOSFET 103. The substrate voltage 105 of the PMOSFET 102 is also at $V_{PP}$.

When $V_{IN}$ is a logical zero, the inverter 100 inverts the signal to a logical one that is applied to the enhancement mode NMOSFET 101. This turns on the NMOSFET 101 thus causing the circuit to discharge to circuit ground, $V_{SS}$. This causes the gate potential of the depletion NMOSFET 103 to be 0V, turning off that transistor 103. The substrate/well voltage of the enhancement PMOSFET 102 is thus 0V. The gate bias for this transistor 102 is 5V (i.e., logical 1) but since the potential of the substrate is smaller than the 5V of the input signal, the PMOSFET 102 will cut off.

FIG. 2 shows a typical example of the relationship between input and output signals of the circuit of FIG. 1. It can be seen that $V_{IN}$ at the bottom goes to $V_{CC}$ causing the $V_{OUT}$ signal to go to $V_{PP}$.

One problem with the prior art switching circuit is that the PMOSFET 102 experiences a large gate to substrate voltage 105. After an extended period of time under this bias, the electron or hole injection causes the threshold voltage, $V_{th}$, to vary as illustrated in FIG. 3. This can cause the switching circuit to fail to turn on if the $V_{th}$ decreases or increase the leakage current of the circuit if $V_{th}$ increases.

For the reasons stated above, and for other reasons stated below which will become apparent to those skilled in the art upon reading and understanding the present specification, there is a need in the art for a switching circuit having an improved reliability.

BRIEF DESCRIPTION OF THE DRAWINGS

FIG. 4 shows a circuit diagram of one embodiment for a high voltage switching circuit of the present invention.

FIG. 5 shows a more detailed circuit diagram of the embodiment of FIG. 4 with operational voltages.

FIG. 6 shows a plot of the relationship of the signals in accordance with the embodiment of FIG. 4.

FIG. 7 shows a plot of the threshold voltage versus time for the embodiment of the FIG. 4.

DETAILED DESCRIPTION

Figure 1:
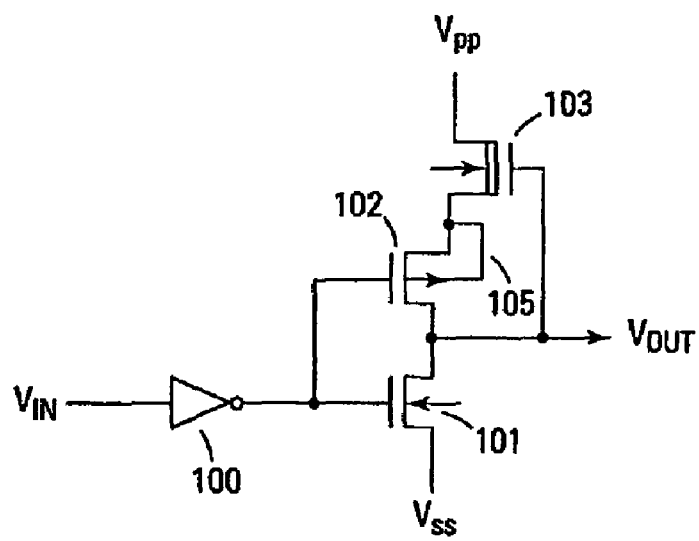
FIG. 1 shows a circuit diagram of a typical prior art high voltage switching circuit.
Figure 2:
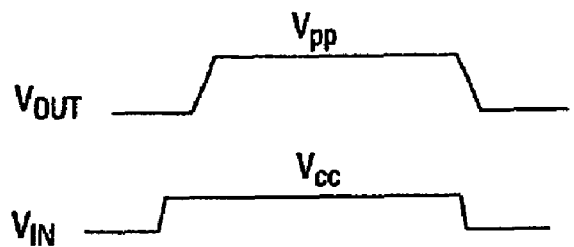
FIG. 2 shows the relationship of the input and output voltages in accordance with the prior art circuit of FIG. 1.
Figure 3:
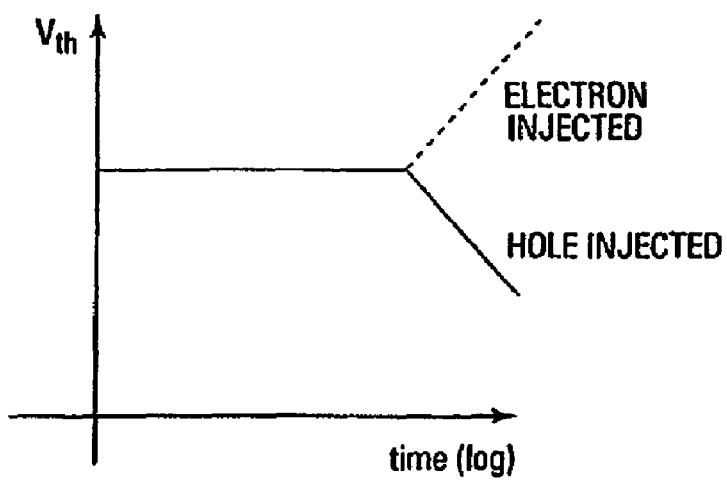
FIG. 3 shows a plot of the threshold voltage versus time for the prior art circuit of FIG. 1.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 4 illustrates a circuit diagram for one embodiment of a high voltage switching circuit of the present invention. This embodiment is comprised of an enhancement mode n-channel MOSFET 401 with its drain coupled to ground ($V_{SS}$) and its source coupled to the drain of an enhancement mode p-channel MOSFET 402.

The source of the PMOSFET 402 is coupled to the source of a depletion mode n-channel MOSFET 403. The gate of the NMOSFET is coupled to the node between the NMOSFET 401 and the PMOSFET 402. This node also acts as $V_{OUT}$. The drain of the depletion NMOSFET 403 is coupled to the high voltage to be switched ($V_{PP}$). The substrate or n-well of the PMOSFET 402 is coupled to the node between the depletion NMOSFET 403 and the PMOSFET 402.

The gate of the enhancement NMOSFET 401 is coupled to an inverter 400 that has $V_{IN}$ as the input. The gate of the enhancement PMOSFET 402 is coupled to an output of a NAND gate 406. One input of the NAND gate 406 is $V_{IN}$ while the second input is $V_{INBD}$. The inverter 400 and NAND gate 406 act as a control circuit to maintain a voltage greater than 0V on the gate of the PMOSFET 402 while $V_{OUT}$ is switched to $V_{PP}$.

$V_{INBD}$ can be generated in different ways. In one embodiment, this voltage is generated by delaying and inverting $V_{IN}$. The delay is illustrated in FIG. 6 as $T_d$. Another embodiment generates $V_{INBD}$ by detecting $V_{OUT}$ and feeding back the delayed voltage to the NAND gate 406 input.

In one embodiment, $V_{PP}$ is 20V and $V_{CC}$ is 3V. However, the present invention is not limited to any one supply voltage or any one switched voltage.

Operation of the high voltage switching circuit of FIG. 4 is described with additional reference to the schematic diagram of FIG. 5 and the voltage signal plot of FIG. 6. FIG. 6 shows that as $V_{IN}$ goes high to $V_{CC}$, $V_{OUT}$ goes from substantially 0V to $V_{PP}$ as $V_{PP}$ is switched to the output of the circuit. This occurs in response to the inverter 400 of FIG. 4 inverting the logical one $V_{IN}$ signal to a logical zero state that then biases the gate of the enhancement NMOSFET 401. This turns off the NMOSFET 401. $V_{IN}$ is also applied to the input of the NAND gate 406 along with $V_{INBD}$.

Initially, since there is a delay between $V_{IN}$ going high and $V_{INBD}$ going low, the output of the NAND gate 406 will be a logical low voltage (i.e., 0V). This biases the gate of the PMOSFET 402 with 0V for time $T_d$, thus turning it on for that time period. During this time, the $V_{OUT}$ node is charged to $V_{PP}$ through the PMOSFET 402 and the depletion mode NMOSFET 403. Time $T_d$ is the only time that the PMOSFET 402 suffers from gate stress. The depletion mode NMOSFET 403 is turned on with $V_{PP}$ applied to the gate. Thus, the node between the PMOSFET 402 and the depletion NMOSFET 403 is at $V_{PP}$.

After $T_d$, $V_{INBD}$ goes low causing the output of the NAND gate 406 to go high. This biases the gate of the PMOSFET 402 with $V_{CC}$ after $T_d$. However, since the well voltage is at $V_{PP}$, the PMOSFET 402 remains on while the gate is at $V_{CC}$.

FIG. 5 illustrates the depletion mode transistor 403 and the enhancement mode transistor 402 at the time when the PMOSFET 402 and the NMOSFET 403 are turned on. The node between the two transistors 402, 403, which is also coupled to the substrate or n-well of the PMOSFET 402, is at $V_{PP}$ at this time. Therefore, the circuit experiences a relaxed gate to substrate voltage since the voltage differential is substantially reduced from the prior art switching circuit.

Referring again to FIGS. 4 and 6, when $V_{IN}$ returns low, the NMOSFET 401 is turned on and the PMOSFET 402 is turned off so that the circuit conducts to ground. $V_{OUT}$ then goes from $V_{PP}$ to 0V. The depletion NMOSFET 403 is turned off by the 0V gate bias.

FIG. 7 illustrates the benefits of the high voltage switching circuit of the present invention. This plot of $V_{th}$ versus time (log scale) shows the threshold voltage variation 701 using the prior art switching circuit. The embodiments of the present invention extend the variation 702 by time t. This time, in one embodiment, is a three orders of magnitude extension of the time to failure of the circuit.

Figure 8:
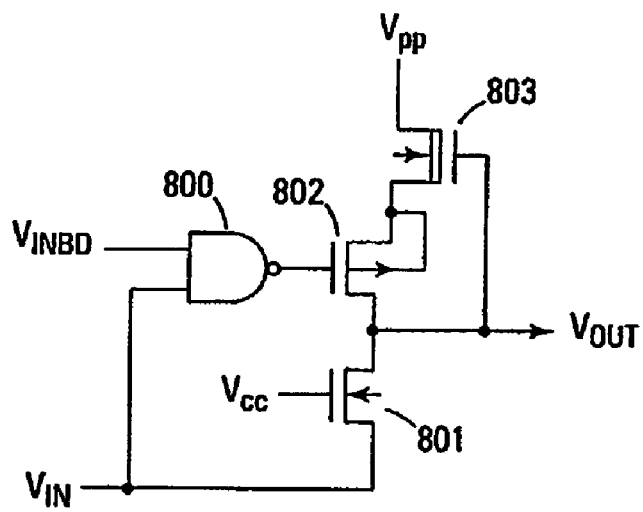
FIG. 8 shows a circuit diagram of an alternate embodiment of the high voltage switching circuit of the present invention.

FIG. 8 illustrates a circuit diagram of an alternate embodiment of the high voltage switching circuit of the present invention. This embodiment is similar to the embodiment of FIG. 4 in that a depletion NMOSFET 803 has its drain coupled to $V_{PP}$ and its source coupled to an enhancement mode PMOSFET 802. The gate of the NMOSFET 803 is coupled to $V_{OUT}$. An enhancement mode NMOSFET 801 is coupled to the drain of the PMOSFET 802.

In the embodiment of FIG. 8, the drain of the enhancement NMOSFET 801 is tied to $V_{IN}$ and the gate to $V_{CC}$ so that the transistor 801 is turned on and conducting when $V_{IN}$ is a logical 0. A NAND gate 800 outputs a logical low to turn on the PMOSFET 802 when both $V_{INBD}$ and $V_{IN}$ are logical highs. Thus, when $V_{IN}$ is low, $V_{OUT}$ is 0V. When $V_{IN}$ is high, $V_{OUT}$ is substantially equal to $V_{PP}$.

Figure 9:
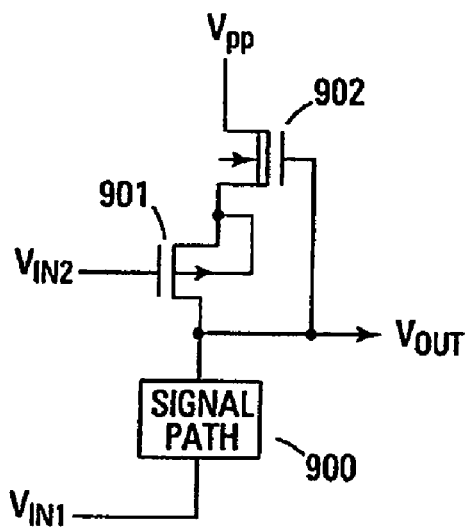
FIG. 9 shows a circuit diagram of another alternate embodiment of the high voltage switching circuit of the present invention.

FIG. 9 illustrates a circuit diagram of yet another alternate embodiment of the high voltage switching circuit of the present invention. This embodiment employs the depletion mode NMOSFET 902 and enhancement mode PMOSFET 901 of previous embodiments. However, in this embodiment, the PMOSFET 901 has its gate coupled to a voltage $V_{IN2}$. A signal path block 900 has an input voltage of $V_{IN1}$ as a control signal and is coupled to the drain of the PMOSFET 901. $V_{IN2}$, in one embodiment, is generated by $V_{IN1}$ and $V_{INDB}$. The signal path circuit block 900 is responsible for providing a high signal to the drain of the PMOSFET 901 when it is desired to switch the high voltage to $V_{OUT}$. When $V_{OUT}$ is desired to be 0V, the signal path circuit 900 provides a ground to the PMOSFET 901.

Figure 10:
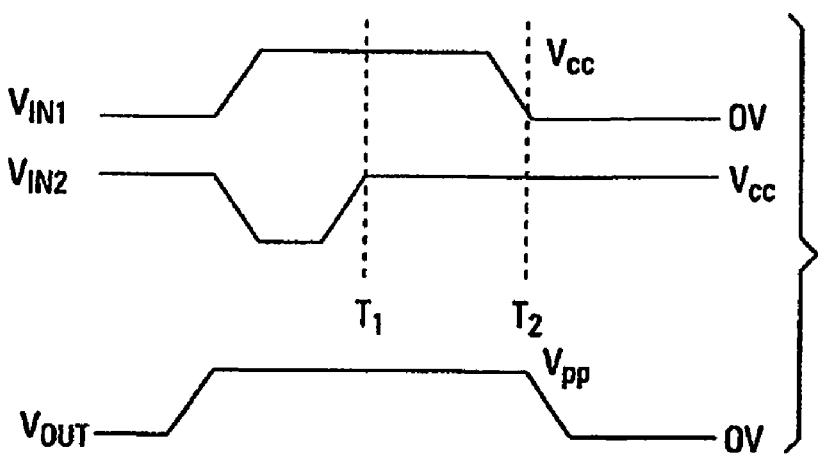
FIG. 10 shows a relationship of the operational voltages of the embodiment of FIG. 9.

FIG. 10 illustrates a timing diagram of the operation of the embodiment of FIG. 9. When $V_{IN1}$ goes high and $V_{IN2}$ goes low to turn on the PMOSFET 901, $V_{PP}$ is switched to $V_{OUT}$. At time $T_1$, $V_{IN2}$ goes back high. At time $T_2$, $V_{IN1}$ goes low and $V_{OUT}$ switches to 0V.

Figure 11:
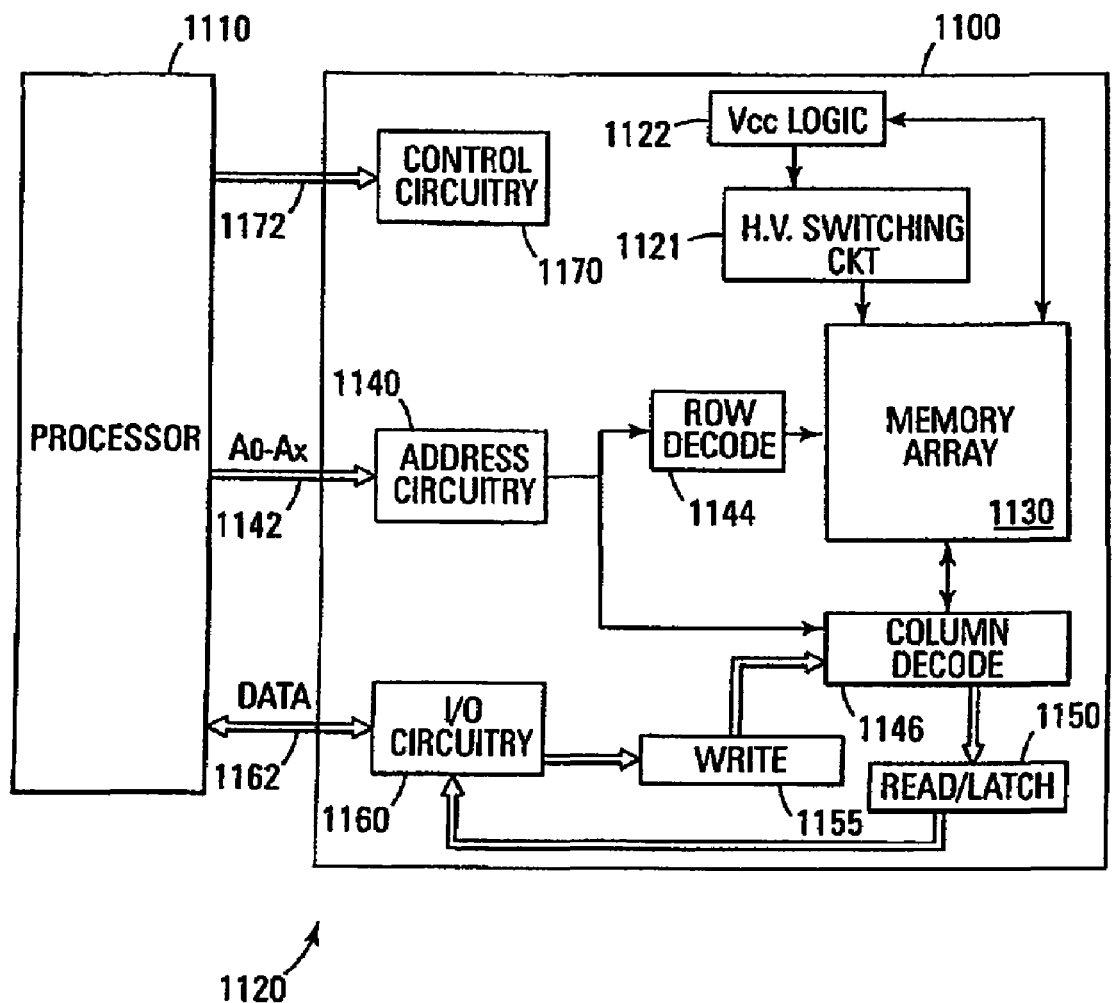
FIG. 11 shows a block diagram of one embodiment of a memory system of the present invention.

FIG. 11 illustrates a functional block diagram of a memory device 1100 of one embodiment of the present invention that is coupled to a processor 1110. The processor 1110 may be a microprocessor, a processor, or some other type of controlling circuitry. The memory device 1100 and the processor 1110 form part of a memory system 1120. The memory device 1100 incorporates the high voltage switching circuit 1121 of the present invention and has been simplified to focus on features of the memory that are helpful in understanding the present invention.

The memory device includes an array of memory cells 1130. In one embodiment, the memory cells are non-volatile floating gate memory cells and the memory array 1130 is arranged in banks of rows and columns.

An address buffer circuit 1140 is provided to latch address signals provided on address input connections A0-Ax 1142. Address signals are received and decoded by a row decoder 1144 and a column decoder 1146 to access the memory array 1130. It will be appreciated by those skilled in the art, with the benefit of the present description, that the number of address input connections depends on the density and architecture of the memory array 1130. That is, the number of addresses increases with both increased memory cell counts and increased bank and block counts.

The above-described embodiments have focused on a NAND architecture memory array. However, the present invention is not limited to this architecture. The embodiments of the memory block erase method of the present invention can be used in any architecture of memory device (e.g., NAND, NOR, AND).

The memory device 1100 reads data in the memory array 1130 by sensing voltage or current changes in the memory array columns using sense/latch circuitry 1150. The sense/latch circuitry, in one embodiment, is coupled to read and latch a row of data from the memory array 1130. Data input and output buffer circuitry 1160 is included for bi-directional data communication over a plurality of data connections 1162 with the controller 1110. Write circuitry 1155 is provided to write data to the memory array.

Control circuitry 1170 decodes signals provided on control connections 1172 from the processor 1110. These signals are used to control the operations on the memory array 1130, including data read, data write, and erase operations. The control circuitry 1170 may be a state machine, a sequencer, or some other type of controller.

The high voltage switching circuit 1121 of the present invention is coupled between $V_{CC}$ logic 1122 and the memory array 1130. The $V_{CC}$ logic 1122 generates the supply voltages and programming/erase voltages that are required by the memory device 1100. The programming/erase voltages are typically greater than the supply voltages. As discussed previously, the high voltage switching circuit 1121 provides the required switching of the high voltages as required by the program and erase operations of the memory device.

The flash memory device illustrated in FIG. 11 has been simplified to facilitate a basic understanding of the features of the memory. A more detailed understanding of internal circuitry and functions of flash memories are known to those skilled in the art.

Figure 12:
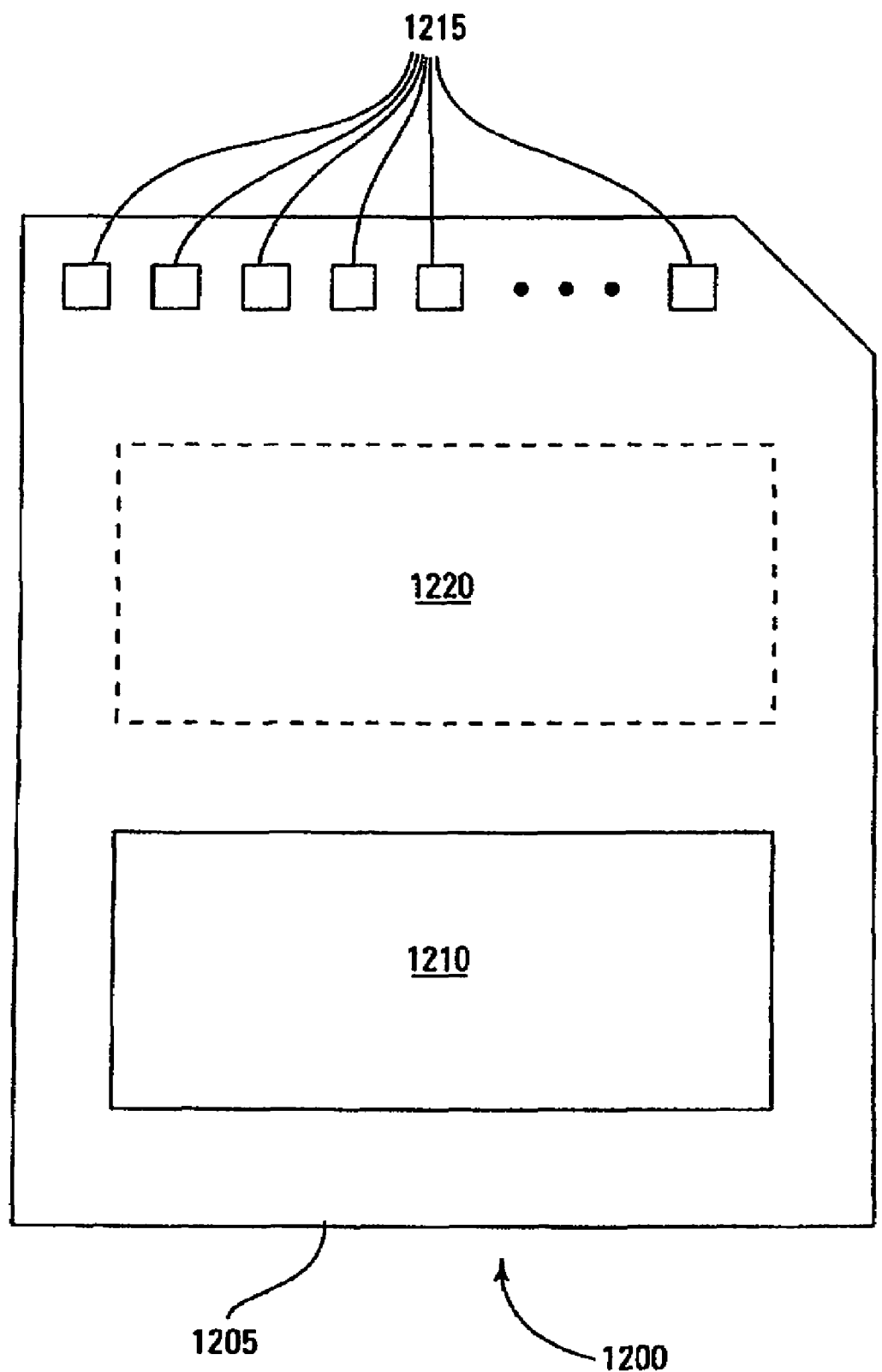
FIG. 12 shows a block diagram of one embodiment of a memory module of the present invention.

FIG. 12 is an illustration of one embodiment of a memory module 1200 that incorporates the flash memory erase method of the present invention. Although memory module 1200 is illustrated as a memory card, the concepts discussed with reference to memory module 1200 are applicable to other types of removable or portable memory, e.g., USB flash drives. In addition, although one example form factor is depicted in FIG. 12, these concepts are applicable to other form factors as well.

Memory module 1200 includes a housing 1205 to enclose one or more memory devices 1210. At least one memory device 1210 is comprised of floating gate memory cells of the present invention. The housing 1205 includes one or more contacts 1215 for communication with a host device. Examples of host devices include digital cameras, digital recording and playback devices, PDAs, personal computers, memory card readers, interface hubs and the like. For some embodiment, the contacts 1215 are in the form of a standardized interface. For example, with a USB flash drive, the contacts 1215 might be in the form of a USB Type-A male connector. For some embodiments, the contacts 1215 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 1215 provide an interface for passing control, address and/or data signals between the memory module 1200 and a host having compatible receptors for the contacts 1215.

The memory module 1200 may optionally include additional circuitry 1220. For some embodiments, the additional circuitry 1220 may include a memory controller for controlling access across multiple memory devices 1210 and/or for providing a translation layer between an external host and a memory device 1210. For example, there may not be a one-to-one correspondence between the number of contacts 1215 and a number of I/O connections to the one or more memory devices 1210. Thus, a memory controller could selectively couple an I/O connection (not shown in FIG. 12) of a memory device 1210 to receive the appropriate signal at the appropriate I/O connection at the appropriate time or to provide the appropriate signal at the appropriate contact 1215 at the appropriate time. Similarly, the communication protocol between a host and the memory module 1200 may be different than what is required for access of a memory device 1210. A memory controller could then translate the command sequences received from a host into the appropriate command sequences to achieve the desired access to the memory device 1210. Such translation may further include changes in signal voltage levels in addition to command sequences.

The additional circuitry 1220 may further include functionality unrelated to control of a memory device 1210. The additional circuitry 1220 may include circuitry to restrict read or write access to the memory module 1200, such as password protection, biometrics or the like. The additional circuitry 1220 may include circuitry to indicate a status of the memory module 1200. For example, the additional circuitry 1220 may include functionality to determine whether power is being supplied to the memory module 1200 and whether the memory module 1200 is currently being accessed, and to display an indication of its status, such as a solid light while powered and a flashing light while being accessed. The additional circuitry 1220 may further include passive devices, such as decoupling capacitors to help regulate power requirements within the memory module 1200.

CONCLUSION

In summary, embodiments for a high voltage switching circuit provide a longer time before failure by reducing the gate to substrate voltage on the PMOSFET transistor. This can provide an increase of three orders of magnitude in the mean time before failure of the circuit.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for reducing gate to body field stress in a transistor of a high voltage switching circuit comprising a first NMOS transistor operating in a depletion mode and coupled to the high voltage, a PMOS transistor coupled between the first NMOS transistor and circuit output, a second NMOS transistor operating in an enhancement mode and coupled to the circuit output, and a control circuit coupled to the PMOS and second NMOS transistors, the method comprising:

generating a first control signal that changes state at a first predetermined time and enables the circuit output;

generating a second control signal that changes state in response to the enabling of the circuit output; and logically combining the first and second control signals for controlling the PMOS transistor and the second NMOS transistor such that the high voltage is switched through the first NMOS transistor and the PMOS transistor to the circuit output and the voltage on a gate connection of the PMOS transistor is greater than 0V in response to the change in state of the second control signal.

2. The method of claim 1 wherein the high voltage is greater than the voltage on the gate connection of the PMOS transistor.

3. The method of claim 1 wherein the high voltage is 20V and the voltage on the gate connection of the PMOS transistor is 3V.

4. A high voltage switching circuit comprising:

a first transistor coupled between the high voltage to be switched and a first node, the first transistor having a gate coupled to a circuit output;

a second transistor coupled between the first transistor and the circuit output, the second transistor having a well connection to the first node;
a third transistor coupled to the second transistor; and
a control circuit coupled to the second and third transistors wherein the control circuit is adapted to switch the high voltage through the first and second transistors to the circuit output and maintain a voltage greater than zero volts on the gate of the second transistor.

5. The circuit of claim 4 wherein the voltage on the gate of the second transistor is elevated above zero volts in response to the circuit output transition to the high voltage level.

6. A high voltage switching circuit comprising:
a first transistor coupled between the high voltage to be switched and a first node, the first transistor having a gate coupled to a circuit output;
a second transistor coupled between the first transistor and the circuit output, the second transistor having a well connection to the first node;
a third transistor coupled to the second transistor; and
a control circuit comprising:
means for generating a first control signal that changes state at a first predetermined time and enables the circuit output;
means for generating a second control signal that changes state in response to the enabling of the circuit output; and
means for logically combining the first and second control signals for controlling the second transistor and the third transistor such that the high voltage is switched through the first transistor and the second transistor to the circuit output and the voltage on a gate connection of the second transistor is greater than 0V in response to the change in state of the second control signal.

7. The circuit of claim 6 wherein the first transistor is a NMOS depletion mode transistor.

8. The circuit of claim 6 wherein the second transistor is a PMOS enhancement mode transistor.

9. The circuit of claim 6 wherein the third transistor is an NMOS enhancement mode transistor.

10. A memory device comprising:
an array of memory cells for storing data;
a voltage generation circuit adapted to generate supply voltages and high level programming voltages;
a high voltage switching circuit comprising:
an NMOS depletion mode transistor coupled between the high voltage to be switched and a first node, the NMOS depletion mode transistor having a gate coupled to a circuit output;
a PMOS transistor coupled between the NMOS depletion mode transistor and the circuit output, the PMOS transistor having a well connection to the first node;
an NMOS enhancement mode transistor coupled to the PMOS transistor; and
a control circuit comprising:
means for generating a first control signal that changes state at a first predetermined time and enables the circuit output;
means for generating a second control signal that changes state in response to the enabling of the circuit output; and
means for logically combining the first and second control signals for controlling the PMOS transistor and the NMOS enhancement mode transistor such that the high voltage is switched through the NMOS depletion mode transistor and the PMOS transistor to the circuit output and the voltage on a gate connection of the PMOS transistor is greater than 0V in response to the change in state of the second control signal.

11. The memory device of claim 10 wherein the array of memory cells comprises FLASH memory cells.

12. An electronic system, the system comprising:
a processor that generates memory device control signals;
a memory device coupled to the processor, the memory device comprising:
an array of memory cells;
control circuitry coupled to the memory device control signals; and
a high voltage switching circuit, the high voltage switching circuit comprising:
a first transistor coupled between the high voltage to be switched and a first node, the first transistor having a gate coupled to a circuit output;
a second transistor coupled between the first transistor and the circuit output, the second transistor having a well connection to the first node;
a third transistor coupled to the second transistor; and
a control circuit coupled to the second and third transistors wherein the control circuit is adapted to switch the high voltage through the first and second transistors to the circuit output and maintain a voltage greater than zero volts on the gate of the second transistor.

* * * * *